(12) United States Patent
Mulder

(10) Patent No.: US 9,325,336 B2
(45) Date of Patent: Apr. 26, 2016

(54) GAIN CALIBRATION OF ADC RESIDUE AMPLIFIERS

(71) Applicant: BROADCOM CORPORATION, Irvine, CA (US)

(72) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/497,255

(22) Filed: Sep. 25, 2014

(65) Prior Publication Data

US 2016/0065230 A1   Mar. 3, 2016

Related U.S. Application Data

(60) Provisional application No. 62/044,022, filed on Aug. 29, 2014.

(51) Int. Cl.
*H03M 1/34* (2006.01)
*H03M 1/10* (2006.01)

(52) U.S. Cl.
CPC .............. *H03M 1/1009* (2013.01); *H03M 1/34* (2013.01)

(58) Field of Classification Search
CPC . H03M 1/165; H03M 1/1023; H03M 1/1004; H03M 1/1038; H03M 1/167; H03M 1/1009; H03M 1/1057; H03M 1/168; H03M 1/1061; H03M 1/0695; H03F 3/45192; H03F 3/45475; H03F 3/45928
USPC .................................. 341/118–162; 327/307
See application file for complete search history.

(56) References Cited

U.S. PATENT DOCUMENTS

| | | | | | |
|---|---|---|---|---|---|
| 5,861,828 | A  * | 1/1999 | Opris | ................... | H03M 1/1057 341/120 |
| 6,084,538 | A  * | 7/2000 | Kostelnik | ............. | H03K 5/2481 341/118 |
| 6,369,744 | B1 * | 4/2002 | Chuang | ............... | H03M 1/0695 341/120 |
| 7,084,804 | B1 * | 8/2006 | Engel | .................. | H03M 1/1004 341/120 |
| 7,460,045 | B1 * | 12/2008 | Cartina | ............... | H03M 1/1009 341/120 |
| 2002/0175843 | A1 * | 11/2002 | Sonkusale | ........... | H03M 1/1004 341/120 |
| 2012/0050087 | A1 * | 3/2012 | Aoki | ........................ | H03G 3/30 341/158 |
| 2012/0249348 | A1 * | 10/2012 | Siragusa | ............. | H03M 1/1009 341/110 |
| 2013/0135127 | A1 * | 5/2013 | Siragusa | ............. | H03M 1/1009 341/110 |
| 2013/0187801 | A1 * | 7/2013 | de Figueiredo | ..... | H03M 1/1009 341/118 |
| 2013/0187802 | A1 * | 7/2013 | de Figueiredo | ..... | H03M 1/1009 341/118 |

* cited by examiner

*Primary Examiner* — Lam T Mai
(74) *Attorney, Agent, or Firm* — McDermott Will & Emery LLP

(57) ABSTRACT

A device for gain calibration of an analog-to-digital converter (ADC) residue amplifier includes a digital-to analog converter (DAC) configured to convert a digital signal to an analog signal. The DAC includes a calibration capacitor that can be used in the gain calibration of the ADC residue amplifier. A flash ADC, including a plurality of comparators and an additional comparator, generates the digital signal. The additional comparator provides a threshold voltage approximately in a middle point of a nominal subrange. The nominal subrange comprises a portion of a voltage range corresponding to threshold voltages of two adjacent comparators of the plurality of comparators.

20 Claims, 4 Drawing Sheets

GAIN CALIBRATION OF ADC RESIDUE AMPLIFIERS

CROSS-REFERENCE TO RELATED APPLICATIONS

This application claims the benefit of priority under 35 U.S.C. §119 from U.S. Provisional Patent Application 62/044,022 filed Aug. 29, 2014, which is incorporated herein by reference in its entirety.

TECHNICAL FIELD

The present description relates generally to input output (I/O) circuits, and more particularly, but not exclusively, to gain calibration of ADC residue amplifiers.

BACKGROUND

Pipeline analog-to-digital converters (ADCs) are used in many devices including communication devices such as Ethernet switches, routers, access points, and mobile communication devices (e.g., cell phones, tablets, personal data assistants (PDAs), etc.). A pipeline ADC may include multiple ADC stages coupled in series, each contributing a number of bits, and a final flash ADC. The bits generated by the ADC stages and the flash ADC are time aligned and digitally corrected for any errors before being encoded by an encoder.

Each stage of the pipeline ADC includes a sample-and-hold (S&H), a flash ADC, a digital-to-analog converter (DAC) such as a multiplying DAC (MDAC), a combiner, and a residue amplifier. In each stage, the S&H samples the input signal and holds the signal steady while the flash ADC quantizes the input signal to a number of bits that form output bits of the stage. Meanwhile, the MDAC converts the output bits of the stage back to an analog signal that is subtracted, using the combiner, from the held sample of the input signal to generate a residue signal. The residue signal is amplified by the residue amplifier and passed to the next stage of the pipeline ADC. In order for the pipeline ADC to achieve a high accuracy, the residue amplifier has to have an accurate gain, which results in a larger area and a higher power consumption and cost. A lower cost and more power efficient method of maintaining the gain is through gain calibration of the residue amplifier.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the disclosure, methods and implementations for gain calibration of the ADC residue amplifier are disclosed. The subject technology includes a number of advantageous features at circuit, system and product levels. At the circuit level, the disclosed solution decreases chip area, improves power consumption of the flash ADC, and improves performance of the MDACS. The system advantages include better ADC performance (e.g., at lower power levels) and improved system performance. At the product level, the subject technology reduces the power consumption and the cost of the product.

Figure 1A:
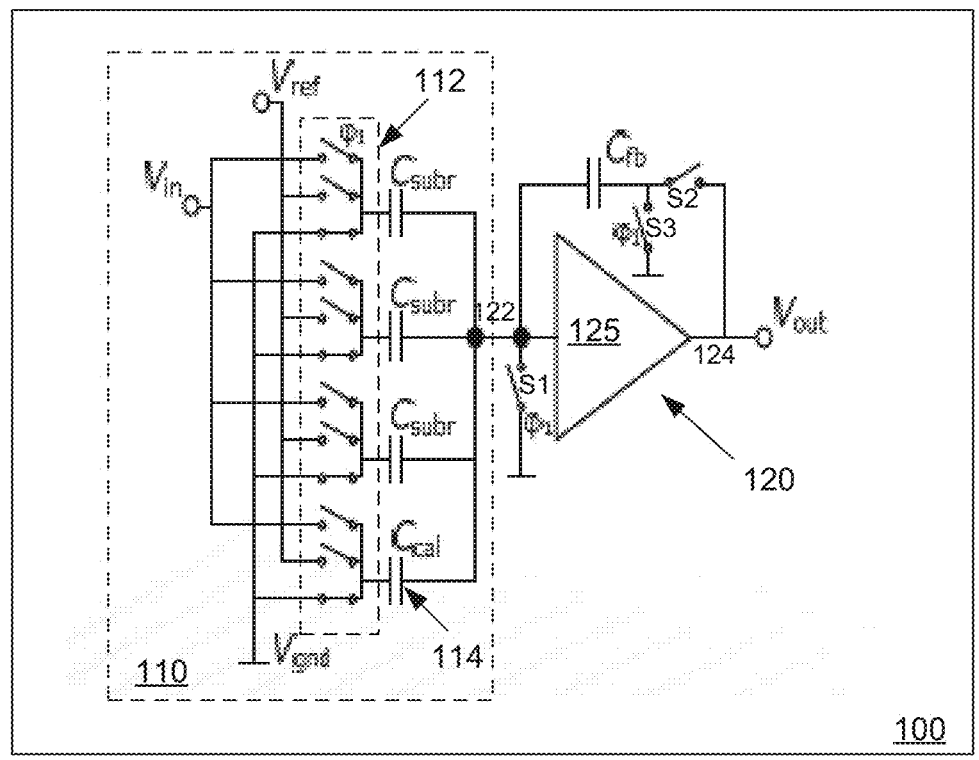
FIG. 1A illustrates an example of a stage of a pipeline analog-to-digital converter (ADC) including a residue amplifier in accordance with one or more implementations.

FIG. 1A illustrates an example of a stage 100 of a pipeline analog-to-digital converter (ADC) including a residue amplifier 120 in accordance with one or more implementations of the subject technology. The pipeline ADC may include multiple of stages, each contributing a number of bits (e.g., 3 bits) to an output device (e.g., an encoder). The bits are generated by a flash ADC of the stage and are provided to a digital-to analog-converter (DAC) (e.g., 110) as a digital input (e.g., Vin). The output of the DAC, at a node 122, is coupled to an input node of a residue amplifier (e.g., 120) that provides the analog input for the next stage. In some aspects, the DAC 110 is a multiplying DAC (MDAC) that can accept an external reference signal (e.g., $V_{ref}$). The MDAC 110 can be a switched-capacitor MDAC including a switch block 112 that can operate on two phases (e.g., $\phi_1$ and $\phi_2$) of a clock signal and subrange capacitors $C_{subr}$. A count of subrange capacitors $C_{subr}$ depends on the number of bits of the MDAC, for example, for an N-bit (e.g., three bit) MDAC, $2^N-1$ (e.g., seven) subrange capacitors $C_{subr}$ are used.

In one or more implementations, the residue amplifier 120 includes an amplifier such as an operational amplifier (Op-Amp) 125 having a feedback capacitor $C_{fb}$ coupled between the input node 122 and an output node 124 of the amplifier 125 through a coupling switch S2. Switches S1 and S3 can couple the input node 122 and the feedback capacitor $C_{fb}$ to ground potential at appropriate phases of the clock signal. In some aspects, at a first phase $\phi_1$ of the clock signal, the switches S1 and S3 are closed, while the switch S2 is open. This allows charging of the subrange capacitors $C_{subr}$ with the digital input $V_{in}$, while discharging the feedback capacitor $C_{fb}$. At a second phase $\phi_2$ of the clock signal, the switches S1 and S3 are open, while the switch S2 is closed and the charges on the subrange capacitors $C_{subr}$ are transferred to the feedback capacitor $C_{fb}$.

In some aspects of the disclosure, the calibration capacitor ($C_{cal}$) 114 is used in a calibration loop for analog calibration of the gain errors of the residue amplifier 120. The calibration of the gain errors of the residue amplifier 120 is crucial to improving the power efficiency of the residue amplifier 120. Injection of the calibration signal into capacitor $C_{cal}$ can be performed by coupling the calibration capacitor 114 to $V_{ref}$ via a switch of the switch block 112. In one or more implementations, the injection of the calibration signal can be determined by a pseudo-random bit sequence (PRBS). To perform the gain calibration accurately and to speed up the calibration loop, a relatively large value can be selected for the capacitance of the calibration capacitor 114. An example suitable value for the capacitance of the calibration capacitor 114 is half the capacitance of the subrange capacitors $C_{subr}$ that complies with a size of a nominal subrange explained below.

The analog calibration of the gain errors of the residue amplifier by using the calibration capacitor 114 can be performed as a background calibration, while the actual input signal is being applied to the MDAC 110. The calibration can be achieved by subtracting the charge on the calibration capacitor 114 from the charges transferred to the feedback capacitor $C_{fb}$ from the subrange capacitors $C_{subr}$. An issue with the analog calibration is that the subtraction can reduce the dynamic range of the residue amplifier 120. The subject technology provides a solution for preserving the dynamic range of the residue amplifier 120, while using the calibration capacitor 114 to perform the calibration. The solution involves an improvement in the flash ADC as further described herein.

Figure 1B:
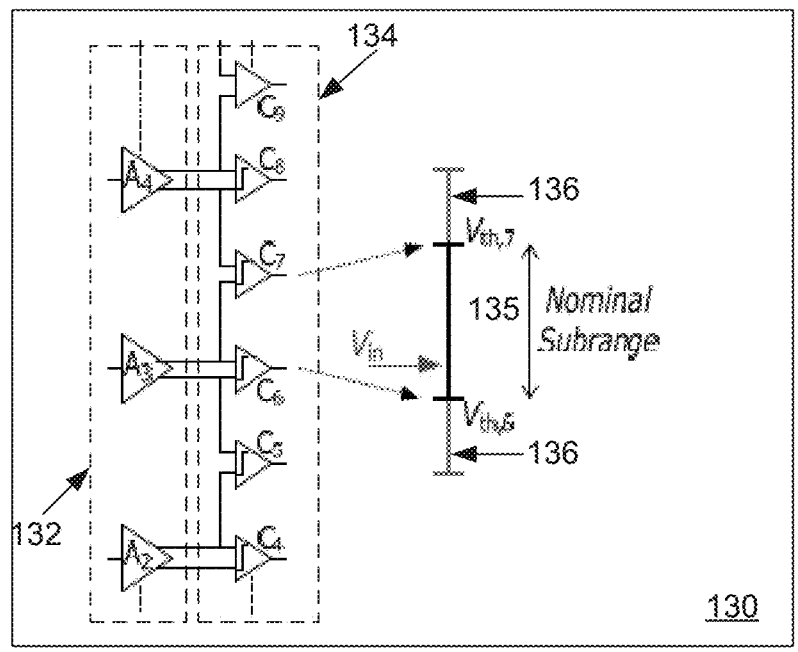
FIG. 1B illustrates an example of a flash ADC of a stage of a pipeline ADC in accordance with one or more implementations.

FIG. 1B illustrates an example of a flash ADC 130 of a stage of the pipeline ADC 100 of FIG. 1B in accordance with one or more implementations of the subject technology. The flash ADC 130 generates the digital signal (e.g., the bits provided as input to MDAC 110 of FIG. 1A) and includes a comparator block 134 containing a number of comparators. The comparators (e.g., $C_j$ such as $C_4 C_5 \ldots C_9$) are driven by pre-amplifiers of a driver block 132. Each comparator (e.g., $C_6$) corresponds to a threshold voltage (e.g., $V_{th,6}$). A voltage distance between the threshold voltages (e.g., $V_{th,6}$ and $V_{th,7}$) of two adjacent comparators (e.g., $C_6$ and $C_7$) is designated as a nominal subrange 135 associated with those comparators. Because the threshold voltages of the comparators are not always accurate, over-range intervals 136 is embedded above and below the nominal subrange 135 to compensate for the offsets of the comparators of the flash ADC 130. For proper operation of the flash ADC 130, provisions are made for the voltage level (e.g., $V_{in}$) of the input signal to remain in the nominal subrange 135 and to not enter the over-range intervals 136.

Using the analog calibration, as explained above, can undesirably push the level of the input signal into the lower over-range interval 136. For example, if the input voltage level $V_{in}$ is close to an edge of the nominal subrange 135, subtracting the calibration signal from the input signal can cause the reside to go far into the over-range 136. This can hurt the performance of the ADC, as the nonlinearity of the residue amplifier is much larger in the over-range 136. Further less over-range being available to compensate for the offsets of the comparators of the flash ADC 130 can result in more restrictions on variation of the size of the chip area and power level of the comparators.

The subject technology provides a low power and low cost solution for preventing the calibration signal from decreasing the dynamic range of the residue amplifier. This is achieved, for example, by keeping the level of the input signal in the nominal subrange 135 via introducing one or more additional comparators, as explained below. The existing solutions are understood to double the resolution of the flash ADC, which undesirably doubles the chip area and power consumption of the flash ADC.

Figure 2A:
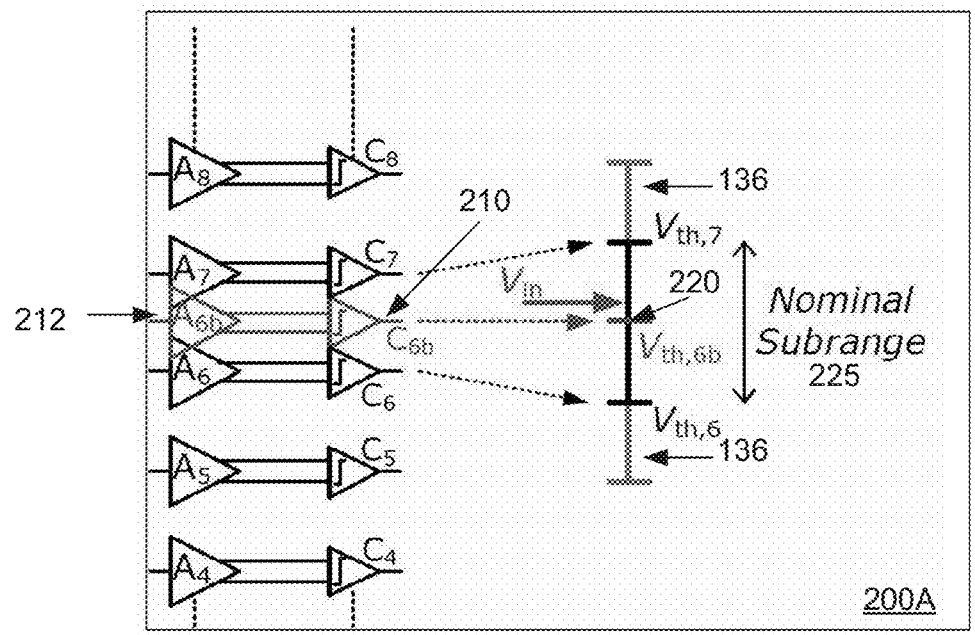
FIGS. 2A-2B illustrate examples of a flash ADC of a stage of a pipeline ADC with one or more additional comparators in accordance with one or more implementations.
Figure 2B:
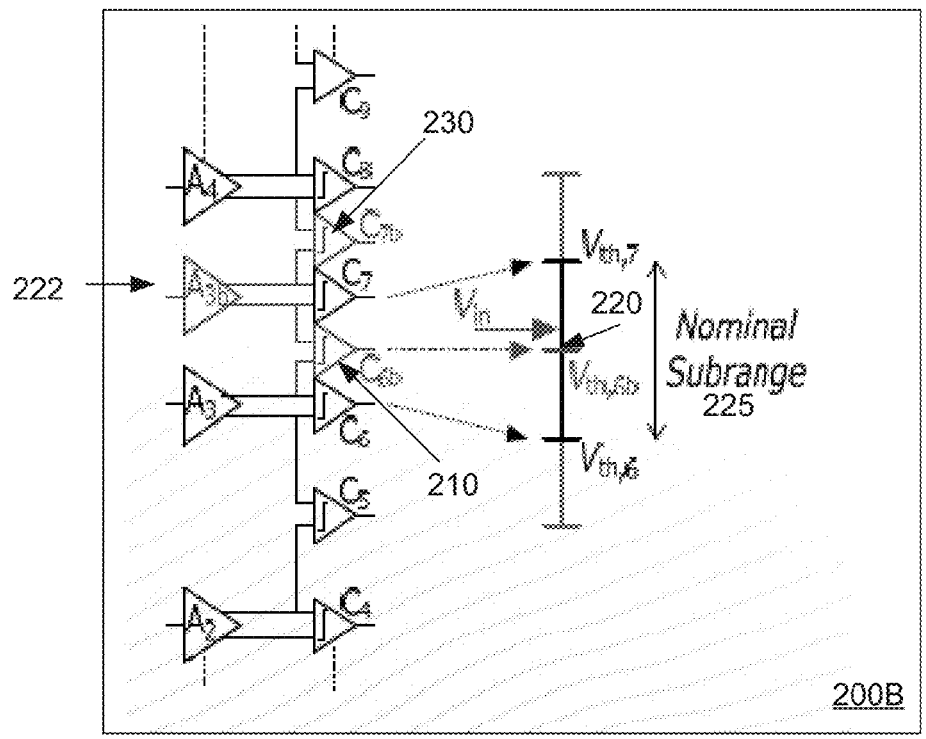

FIGS. 2A-2B illustrate examples of a flash ADC of a stage of a pipeline ADC with one or more additional comparators in accordance with one or more implementations of the subject technology. The flash ADC 200A shown in FIG. 2A is similar to the flash ADC 130 of FIG. 1B, except for an additional comparator 210 and an additional preamplifier 212 that drives the additional comparator 210. The additional comparator 210 provides a corresponding threshold voltage ($V_{th,6b}$) 220 with a level approximately in the middle of the nominal subrange 225. This allows the calibration to be added in the nominal subrange 225 without decreasing the dynamic range of the MDAC 110 of FIG. 1A.

Using the threshold voltage 220, the flash ADC 200A can determine whether the input signal $V_{in}$ is located in the upper half of the nominal subrange 225 (e.g., between $V_{th,6b}$ and $V_{th,7}$). If the input signal $V_{in}$ is located in the upper half of the nominal subrange 225, the subtraction of the calibration signal from the input signal does not cause the calibrated signal to fall within the over-range 136 and is allowed. Otherwise the subtraction is prevented to disallow usage of the over-range intervals 136 and injection of the calibration is postponed to the next sample of the input signal as determined by the PRBS signal. In other words, the injection of the calibration signal is allowed when the amplitude of the input signal is larger than the threshold voltage 220 of the additional comparator 210.

In some implementations, as shown in the flash ADC 200B of FIG. 2B, two or more additional comparators (e.g., 210 and 230) can be used to prevent decreasing of the dynamic range of the MDAC 110 by allowing the addition of the calibration signal in two or more subranges, as discussed above with respect to the nominal subrange 225. For example, the threshold voltage of the additional comparator $C_{7b}$ can be set to a middle point of a subrange between the threshold voltages of the comparators $C_7$ and $C_8$. When two additional comparators are added, one additional preamplifier 222 (e.g., $A_{3b}$) would be sufficient. The implementation of one or two additional comparators, instead of doubling the resolution of, for example, a 4-bit flash ADC can result in saving of up to 45% in chip area and power consumption.

Figure 3:
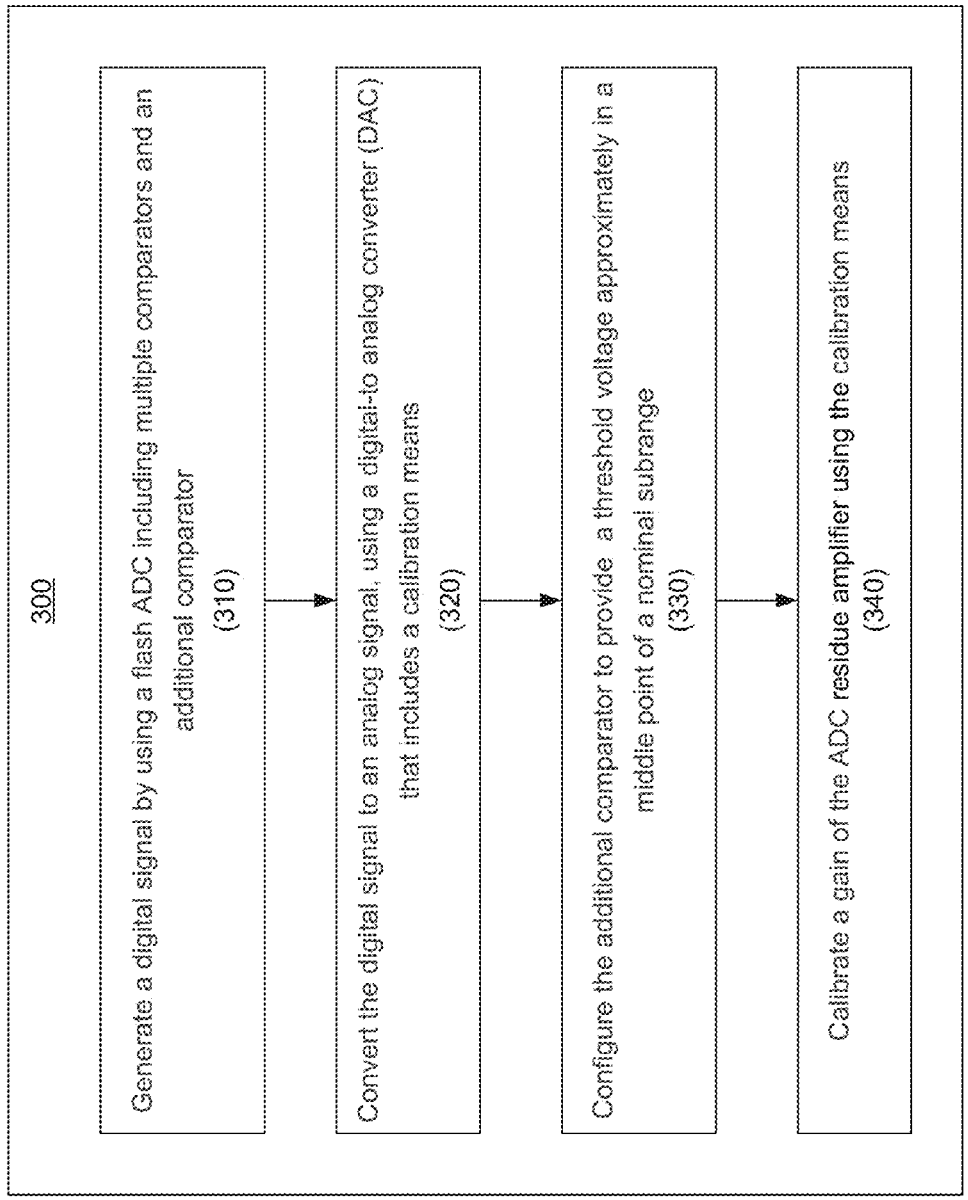
FIG. 3 illustrates an example of a method for gain calibration of an ADC residue amplifier in accordance with one or more implementations.

FIG. 3 illustrates an example of a method 300 for gain calibration of an ADC residue amplifier in accordance with one or more implementations of the subject technology. For explanatory purposes, the blocks of the example method 300 are described herein as occurring in serial, or linearly. However, multiple blocks of the example method 300 can occur in parallel. In addition, the blocks of the example method 300 need not be performed in the order shown and/or one or more of the blocks of the example method 300 need not be performed.

The method 300 includes generating a digital signal by using a flash ADC (e.g., 130 of FIG. 1B) including a plurality of comparators (e.g., 134 of FIG. 1B) and an additional comparator (e.g., 210 of FIG. 2A) (310). The digital signal is converted to an analog signal, using a digital-to analog converter (DAC) (e.g., 110 of FIG. 1A) that includes a calibration means (e.g., 114 of FIG. 1A) (320). The additional comparator provides a threshold voltage (e.g., 220 of FIG. 2A) approximately in a middle point of a nominal subrange (e.g., 225 of FIG. 2A) (330). The nominal subrange includes a portion of a voltage range corresponding to threshold voltages (e.g., $V_{th,6}$ and $V_{th,7}$ of FIG. 2A) of two adjacent comparators (e.g., $C_6$ and $C_7$ of FIG. 2A) of the plurality of comparators. A gain of the ADC residue amplifier is calibrated using the calibration means (340).

Figure 4:
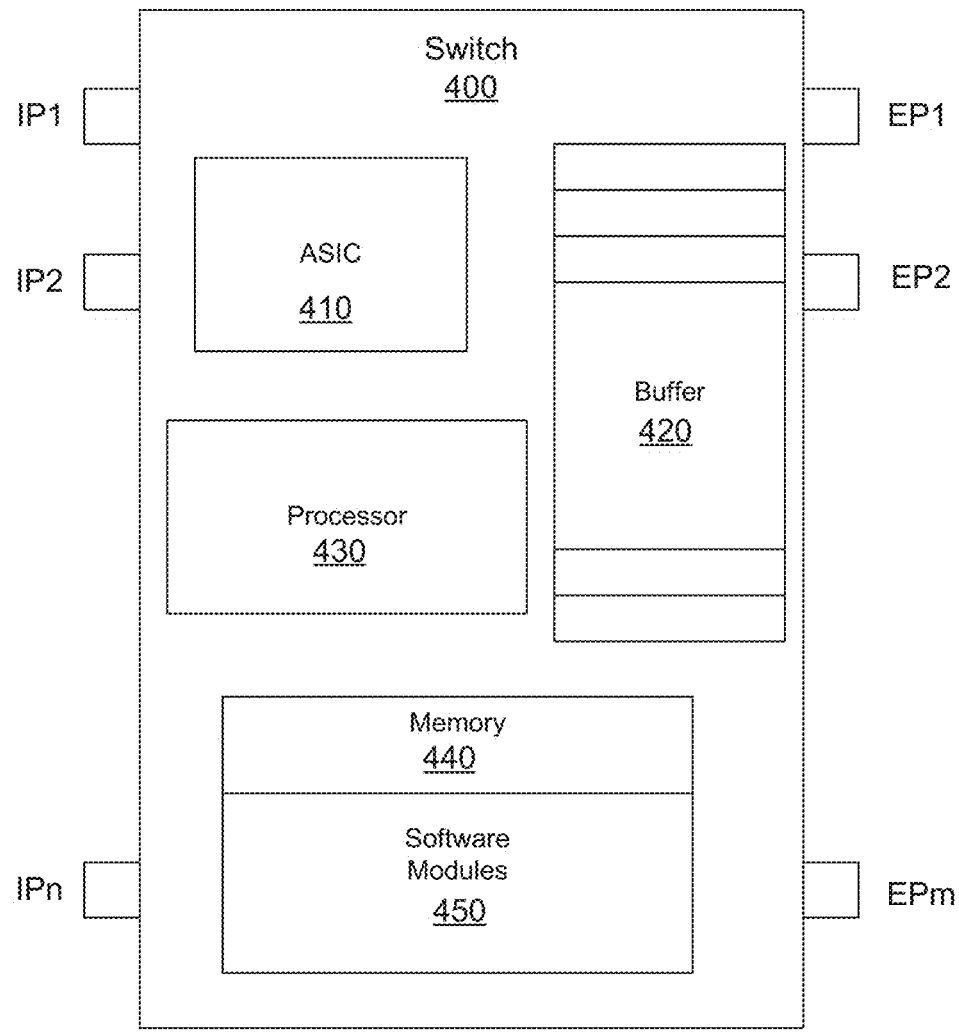
FIG. 4 illustrates an example of a communication device employing features of the subject technology gain calibration of an ADC residue amplifier in accordance with one or more implementations.

FIG. 4 illustrates an example of a communication device 400 employing features of the subject technology gain calibration of an ADC residue amplifier in accordance with one or more implementations of the subject technology. Examples of the communication device 400 includes an Ethernet switch of an Ethernet network such as a private network including a data-center network, an enterprise network, or other private networks. The communication device 400 includes a number of ingress (input) ports IP1-IPn and multiple egress (output) ports EP1-EPm. In one or more implementations, one or more of the ingress ports IP1-IPn can receive a data packet from another switch or and endpoint device of the network. The communication device 400 further includes a hardware component such as an application specific integrated circuit (ASIC) 410 (which in some embodiments can be implemented as a field-programmable logic array (FPGA)), a buffer 420, a processor 430, memory 440, and a software module 450.

In some implementations, the ASIC 410 can include suitable logic, circuitry, interfaces and/or code that can be operable to perform functionalities of a PHY circuit. In one or more implementations, the PHY circuit includes a pipeline ADC including multiple ADC stages. Some of the ADC stages can include a residue amplifier that can be calibrated using a calibration capacitor (e.g., 114 of FIG. 1A). A flash ADC of the ADC stages can include an additional comparator (e.g., 210 of FIG. 2A) that can provide a threshold voltage approximately in a middle point of a nominal subrange (e.g., 225 of FIG. 2A) to allow prevention of the calibration signal from reducing the dynamic range of the ADC, as discussed above. The nominal subrange is a portion of a voltage range corresponding to threshold voltages of two adjacent comparators.

The buffer 420 includes suitable logic, circuitry, code and/or interfaces that are operable to receive and store and/or delay a block of data for communication through one or more of the egress ports EP1-EPm. The processor 430 includes suitable logic, circuitry, and/or code that can enable processing data and/or controlling operations of the communication device 400. In this regard, the processor 430 can be enabled to provide control signals to various other portions of the communication device 400. The processor 430 also controls transfers of data between various portions of the communication device 400. Additionally, the processor 430 can enable implementation of an operating system or otherwise execute code to manage operations of the communication device 400.

The memory 440 includes suitable logic, circuitry, and/or code that can enable storage of various types of information such as received data, generated data, code, and/or configuration information. The memory 440 includes, for example, RAM, ROM, flash, and/or magnetic storage. In various embodiment of the subject technology, the memory 440 may include a RAM, DRAM, SRAM, T-RAM, Z-RAM, TTRAM, or any other storage media. The memory 440 can include software modules 450 that when executed by a processor (e.g., processor 430) can perform some or all of the functionalities of the ASIC 410. In some implementations, the software modules 450 include codes that when executed by a processor can perform functionalities such as configuration of the communication device 400.

In some implementations, the ingress ports IP1-IPn and the egress ports EP1-EPm of the communication device 400 may be implemented as pads 102 of FIG. 1A, each associated with an I/O interface device (e.g., 110 of FIG. 1A). The I/O interface device uses the features of the subject technology, as discussed above, to permit a high-voltage fail-safe operation of the I/O interface devices of the ingress ports IP1-IPn and the egress ports EP1-EPm.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for gain calibration of an analog-to-digital converter (ADC) residue amplifier, the device comprising:
   a digital-to analog converter (DAC) configured to convert a digital signal to an analog signal, the DAC including a calibration means configured for being used in the gain calibration of the ADC residue amplifier; and
   a flash ADC configured to generate the digital signal, the flash ADC including a plurality of comparators and an additional comparator,
   wherein a count of the plurality of comparators is equal to a number of output bits of the flash ADC and the additional comparator is configured to provide a threshold voltage approximately in a middle point of a nominal subrange, wherein the nominal subrange comprises a portion of a voltage range corresponding to threshold voltages of two adjacent comparators of the plurality of comparators.

2. The device of claim 1, wherein the flash ADC is configured to generate the digital signal by conversion to digital of a sample of an input signal.

3. The device of claim 2, wherein the device comprises a part of a stage of a pipeline ADC that includes the ADC residue amplifier that is configured to amplify a residue signal.

4. The device of claim 3, wherein the residue signal is created by subtraction of the analog signal from the sample of the input signal.

5. The device of claim 1, wherein the DAC comprises a multiplying DAC (MDAC), wherein the calibration means includes a calibration capacitor, and wherein during a phase of a clock signal the calibration capacitor is charged by a reference voltage.

6. The device of claim 5, wherein the calibration capacitor is configured to be charged to a voltage level that is approximately equal to half of the nominal subrange, and wherein the threshold voltage provided by the additional comparator is set to prevent an adverse effect of a calibration signal on a dynamic range of the ADC residue amplifier.

7. The device of claim 1, wherein the gain calibration of the ADC comprises a background calibration, wherein the background calibration is performed by injection of a calibration signal to the DAC.

8. The device of claim 7, wherein the injection of the calibration signal is controlled by a pseudo-random bit sequence (PRBS) and is allowed when an amplitude of the input signal is larger than the threshold voltage of the additional comparator.

9. The device of claim 7, wherein the flash ADC comprises other additional comparators, and wherein the injection of the calibration signal is allowed when the amplitude of the input signal is larger than a threshold voltage of one of the other additional comparators.

10. A method for gain calibration of an analog-to-digital converter (ADC) residue amplifier, the method comprising:
    generating a digital signal by using a flash ADC including a plurality of comparators and an additional comparator, wherein a count of the plurality of comparators is equal to a number of output bits of the flash ADC;
    converting the digital signal to an analog signal, using a digital-to analog converter (DAC);
    configuring the additional comparator to provide a threshold voltage approximately in a middle point of a nominal subrange, wherein the nominal subrange comprises a portion of a voltage range corresponding to threshold voltages of two adjacent comparators of the plurality of comparators; and
    calibrating a gain of the ADC residue amplifier using a calibration signal.

11. The method of claim 10, further comprising using flash ADC to convert to digital a sample of an input signal to generate the digital signal.

12. The method of claim 11, wherein the flash ADC and the DAC comprise parts of a stage of a pipeline ADC that includes the ADC residue amplifier, and wherein the method comprises configuring the ADC residue amplifier to amplify a residue signal.

13. The method of claim 12, further comprising creating the residue signal by subtraction of the analog signal from the sample of the input signal.

14. The method of claim 10, wherein the DAC comprises a multiplying DAC (MDAC), and wherein the method further comprises generating a calibration signal by charging a calibration capacitor by using a reference voltage during a phase of a clock signal.

15. The method of claim 14, further comprising:
    choosing a capacitance value for the calibration capacitor that allows charging of the calibration capacitor to a voltage level that is approximately equal to half of the nominal subrange, and
    setting the threshold voltage provided by the additional comparator to prevent an adverse effect of the calibration signal on a dynamic range of the ADC residue amplifier.

16. The method of claim 10, wherein calibrating the gain of the ADC comprises performing a background calibration, and wherein performing the background calibration comprises injection of a calibration signal to the DAC.

17. The method of claim 16, further comprising controlling the injection of the calibration signal by using a pseudo-random bit sequence (PRBS) and allowing the injection of the calibration signal when an amplitude of the input signal is larger than the threshold voltage of the additional comparator.

18. The method of claim 16, wherein the flash ADC comprises other additional comparators, and wherein the method further comprises allowing the injection of the calibration signal when the amplitude of the input signal is larger than a threshold voltage of one of the other additional comparators.

19. A communication device comprising:
    a pipeline ADC comprising a plurality of stages, at least some of the stages comprising:

a digital-to analog converter (DAC) configured to convert a digital signal to an analog signal;

a flash ADC configured to generate the digital signal, the flash ADC including a plurality of comparators and an additional comparator, wherein a count of the plurality of comparators is equal to a number of output bits of the flash ADC; and a residue amplifier configured to be calibrated by using a calibration signal, wherein the additional comparator is configured to provide a threshold voltage approximately in a middle point of a nominal subrange, and wherein the nominal subrange comprises a portion of a voltage range corresponding to threshold voltages of two adjacent comparators of the plurality of comparators.

20. The communication device of claim 19, wherein:

the flash ADC is configured to generate the digital signal by conversion to digital of a sample of an input signal, the residue amplifier is configured to amplify a residue signal that is created by subtraction of the analog signal from the sample of the input signal, during a phase of a clock signal, the calibration signal is generated by a calibration capacitor that is charged by a reference voltage to a voltage level that is approximately equal to half of the nominal subrange, and the threshold voltage provided by the additional comparator is set to prevent an adverse effect of the calibration signal on a dynamic range of the ADC residue amplifier.

\* \* \* \* \*